United States Patent [19]

Ebel

[11] 4,441,172

[45] Apr. 3, 1984

[54] SEMICONDUCTOR MEMORY CORE PROGRAM CONTROL CIRCUIT

[75] Inventor: Mark S. Ebel, Santa Clara, Calif.

[73] Assignee: National Semiconductor Corporation, Santa Clara, Calif.

[21] Appl. No.: 334,697

[22] Filed: Dec. 28, 1981

[51] Int. Cl.³ .............................................. G11C 7/00
[52] U.S. Cl. .................................... 365/226; 365/189
[58] Field of Search ............... 365/226, 227, 228, 229, 365/189, 230, 94, 104

[56] References Cited

U.S. PATENT DOCUMENTS 4,094,012 6/1978 Perlegos et al. .................... 365/226
4,368,524 1/1983 Nakamura et al. ................. 365/226

Primary Examiner—Joseph A. Popek
Attorney, Agent, or Firm—Michael J. Pollock; Paul J. Winters; Gail W. Woodward

[57] ABSTRACT

A circuit to restrain the rise time of a programming pulse generated in an electrically alterable read-only semiconductor memory in which excessively sudden changes in the pulse are capacitively coupled, through active devices that can be built on the chip, to a grounding switch device so as to periodically drain away the control signal used to create the pulse.

10 Claims, 1 Drawing Figure

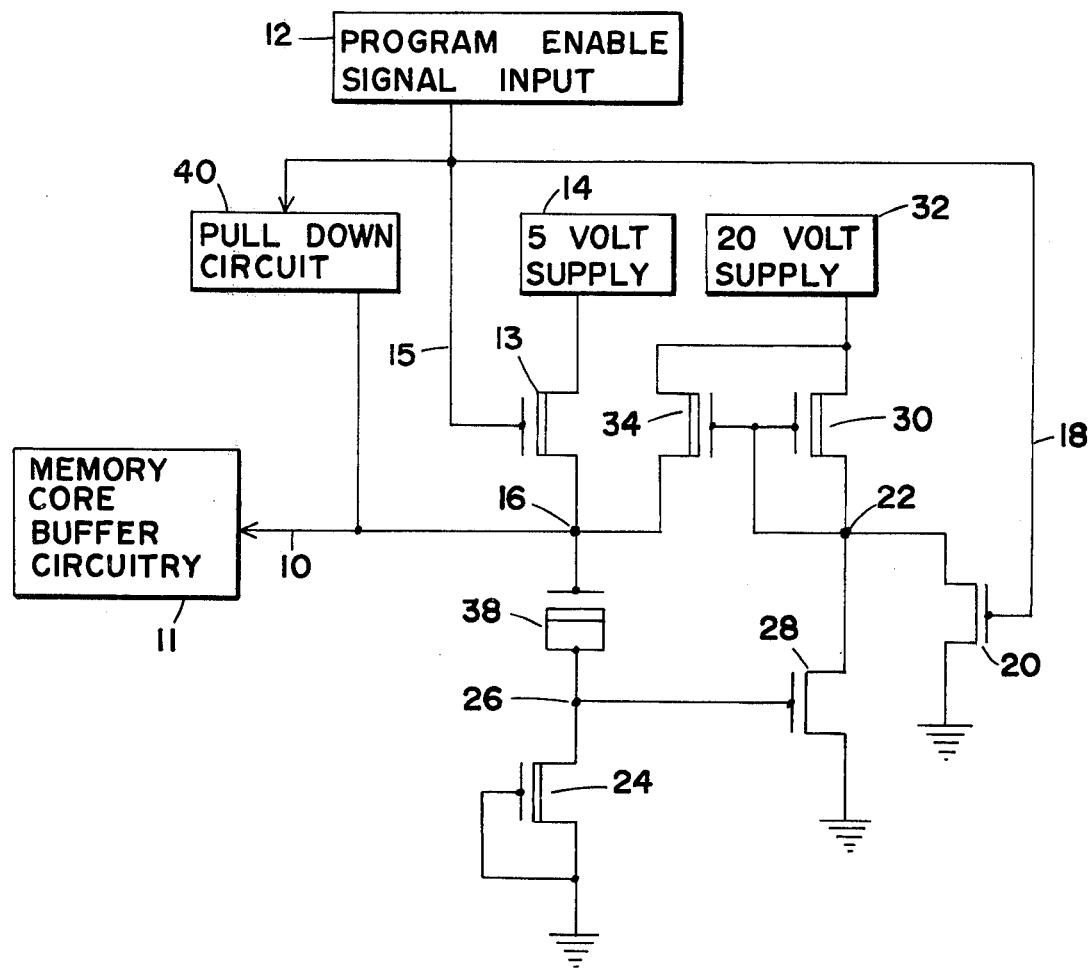

SEMICONDUCTOR MEMORY CORE PROGRAM CONTROL CIRCUIT

BACKGROUND OF THE INVENTION

Electrically alterable read-only semiconductor memories may be constructed using floating gate field effect transistors as storage cells in the core. Each cell is read by directing a 5-volt signal thereto and sensing any resulting current flow in the cell. Current flow is affected by the presence of charge on the floating gate which charge is urged on or off the gate by a 20-volt programming pulse directed to the cell over the same program line used for the 5-volt signal.

When the program line is changed from 5 volts to 20 volts, the sudden increase can be injurious to the storage cell, especially those cells that utilize a very thin oxide layer through which charge is tunneled to the floating gate. Also, sudden increases may cause spurious programming of unselected storage cells. Consequently, good design practice involves restricting the program pulse rise time to about 600 microseconds, which is quite slow in comparison to device times in typical memories. Typically, the rise time constraint must be applied externally to the semiconductor chip. It would be desirable, however, to free a system designer from this restraint by controlling the rise time of the programming pulse internally, on the chip itself. My invention provides a circuit which permits such an on chip control of rise time.

SUMMARY OF THE INVENTION

In brief, the new circuit described herein utilizes a field effect, depletion mode, transistor device to raise the voltage on the program line from 5 volts to 20 volts. The gate of this transistor is connected to a secondary node and controlled by the secondary node voltage. If the voltage rises excessively fast on the program line, the sudden change is capacitively coupled to another transistor, in this case an enhancement mode device, turning the other transistor on so as to drain away some of the voltage at the secondary node. Since the depletion mode transistor is controlled by the secondary node voltage, the increase in voltage on the program line is restrained to a safe level, thus, avoiding spurious programming and internal cell damage. The circuit is formed from active enhancement mode and depletion mode devices that can be manufactured in a reasonable amount of space on the semiconductor chip.

BRIEF DESCRIPTION OF THE DRAWING

The drawing shows a schematic diagram of the circuit utilized in the preferred embodiment.

DESCRIPTION OF THE PREFERRED EMBODIMENT

In the drawing, a program line 10 is shown, upon which it is desirable to raise the voltage from 5 volts to 20 volts so as to create a programming pulse at a selected storage cell in a memory core 11. A program enable input 12 supplies an input signal of either 0 or 5 volts to control the creation of the programming pulse on line 10. Line 10 is coupled to a first circuit node 16 where the program pulse is developed.

The input signal is coupled on line 15 to gate of a depletion mode device 13, and on line 18 to the gate of an enhancement mode device 20. In the preferred embodiment, the depletion mode devices normally conduct current unless the gate is more than about 3 volts below the source and the enhancement mode devices conduct current only if the gate voltage is over a threshold voltage of about 1 volt. With the input signal in a first condition of about 5 volts, both devices 13 and 20 are conducting, or on, so that node 16 is connected to a 5 volt supply 14 and a second circuit node 22 is connected to ground or 0 volts. Another depletion mode device 24 has its gate tied to its source so that the gate always exceeds the −3 volt threshold. Hence, device 24 is always on and may be thought of as simply a resistive current path between a third circuit node 26 and ground. In the absence of any other applied voltage, node 26 is therefore also at 0 volts. This 0 volt signal is applied to the gate of an enhancement mode device 28. Device 28 is thus off or non-conducting.

A depletion mode device 30, with its gate tied to its source, forms another resistive current path between a 20 volt supply 32 and node 22. This would raise the voltage at node 22 but for the fact that device 20 is chosen to have a much larger conductance than device 30 so that node 22 remains clamped to zero volts.

A depletion mode device 34 connected between 20 volt supply 32 and node 16 is held off by the 0 volt signal applied to its gate by node 22. Thus, device 13 may be thought of as a first switching means to urge node 16 toward 5 volts while device 34 may be thought of as a second switching means to urge node 16 toward 20 volts.

To generate the program pulse, the input voltage on lines 15 and 18 is changed by input 12 from 5 volts to 0 volts. Devices 13 and 20 turn off releasing nodes 16 and 22 from their respective 5 volt and 0 volt conditions. The current flow through device 30 increases the voltage on node 22 and thereby the gate of device 34. Device 34 turns on and the current flow therethrough raises the voltage at node 16 toward 20 volts. However, if the voltage at node 16 rises too fast, so as to create a damaging program pulse, that sudden change is capacitively coupled back through a depletion mode device 38 to node 26 and the gate of device 28. Device 28 turns on to drain away to ground some of the voltage at node 22. This slowing down of the voltage rise at node 22, in turn, slows down the rise at node 16 produced by device 34 which responds to the node 22 voltage. Device 38 is of the type in which the source and drain are tied together, and to node 26, and the gate is connected to node 16 to produce a capacitive coupling therebetween.

Thus, the combination of devices 20 and 30 comprises a means to increase the voltage of node 22 under the restraint of a suitable voltage decreasing means, such as device 28, which operates to diminish the effect of the voltage increasing means on node 22. Device 28 is, in turn, controlled by the combination of devices 38 and 24, which combination may be thought of as a control signal generating means. When the input signal on line 15 once again returns to the first condition of 5 volts, a suitable pull down circuit 40 restores program line 10 and node 16 to the original 5 volt level in a manner well known to those skilled in the art. Of course, other variations will occur to those skilled in the art for creating circuits that can be formed on the chip and also perform the functions of increasing voltage, decreasing or diminishing the voltage, and controlling the decreasing means, as well as switching the program lines between 5 and 20 volt sources. Because of these variations I do not intend to be limited to the exact circuit shown in the drawing except as defined by the appended claims.

I claim:

1. A control circuit for regulating the programming pulse presented to the core of an electrically alterable read-only semiconductor memory, said memory being of the type in which a selected bit is read by introducing a low voltage on a program line from a low voltage supply and said selected bit is programmed by introducing a high voltage on the same program line from a high voltage supply, said control circuit being formed on the semiconductor chip and comprising:

a first circuit node electrically coupled to the program line;

first switching means connected to said first node and adapted for connection to said low voltage supply, operable in response to the reception of a first input signal to connect said first node to the low voltage supply and in response to a second input signal to disconnect said first node from said low supply;

a second circuit node;

second switching means connected to said first node and adapted for connection to said high voltage supply and also controllably coupled to said second node, operable in response to the voltage at said second node to increase the voltage at said first node toward the high voltage of said high voltage supply and thereby produce said programming pulse;

a voltage increasing means connected to said second node, operable in response to the reception of said first input signal to hold said second node at a voltage such that said second switching means does not change the first node voltage and operable in response to the reception of said second input signal to increase the second node voltage;

a voltage decreasing means connected to said second node operable in response to a control signal to control the voltage increase on said second node; and control signal generating means coupled to said first node and to said decreasing means, operable to produce said control signal in response to excessively fast increases in the first node voltage so as to activate said decreasing means.

2. The circuit of claim 1 in which said control signal generating means comprises a third circuit node, a capacitive coupling means between said first and third nodes, a first resistive current path between said third node and ground, and a control signal path between said third node and said decreasing means.

3. The circuit of claim 2 in which said increasing means includes a second resistive current path between said second node and said high voltage supply, and a third switching means between said second node and ground and in which said decreasing means comprises fourth switching means connected between said second node and ground.

4. The circuit of claim 3 in which said capacitive coupling means comprises a depletion mode device with its gate connected to said first node and its source and drain connected to said third node and said first resistive path comprises a depletion mode device with its gate and source connected to ground and its drain connected to the third node and in which said second resistive path comprises a depletion mode device with its gate and source connected to the second node and its drain connected to the high voltage supply and said third switching means comprises an enhancement mode device adapted to receive said input signals on its gate and in which the fourth switching means is an enhancement mode device adapted to receive said control signal on its gate.

5. The circuit of claim 4 in which the first switching means comprises a depletion mode device connected to receive said input signals on its gate, and in which the second switching means comprises a depletion mode device having its control gate connected to said second node.

6. The circuit of claim 2 in which said capacitive coupling means comprises a depletion mode device with its gate connected to said first node and its source and drain connected to said third node and said first resistive path comprises a depletion mode device with its gate and source connected to ground and its drain connected to the third node.

7. The circuit of claim 1 in which said increasing means includes a second resistive current path between said second node and said high voltage supply, and a third switching means between said second node and ground.

8. The circuit of claim 7 in which said second resistive path comprises a depletion mode device with its gate and source connected to the second node and its drain connected to the high voltage supply and said third switching means comprises an enhancement mode device adapted to receive said input signals on its gate.

9. The circuit of claim 1 in which said decreasing means comprises fourth switching means connected between said second node and ground.

10. The circuit of claim 9 in which the fourth switching means is an enhancement mode device adapted to receive said control signal on its gate.

* * * * *